(12) United States Patent
Chen et al.

(10) Patent No.: US 10,859,918 B2
(45) Date of Patent: Dec. 8, 2020

(54) SEMICONDUCTOR APPARATUS AND METHOD OF OPERATING THE SAME

(71) Applicant: TAIWAN SEMICONDUCTOR MANUFACTURING CO., LTD., Hsinchu (TW)

(72) Inventors: Kuan-Hung Chen, Taoyuan (TW); Chieh Hsieh, Taoyuan (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/261,695

(22) Filed: Jan. 30, 2019

(65) Prior Publication Data

US 2020/0133136 A1 Apr. 30, 2020

Related U.S. Application Data

(60) Provisional application No. 62/753,059, filed on Oct. 30, 2018.

(51) Int. Cl.
*G03F 7/20* (2006.01)

(52) U.S. Cl.
CPC ...... *G03F 7/70033* (2013.01); *G03F 7/70058* (2013.01)

(58) Field of Classification Search
CPC .......... H05G 2/00; H05G 2/001; H05G 2/003; H05G 2/005; H05G 2/006; H05G 2/008
USPC ...................................... 250/504 R
See application file for complete search history.

(56) References Cited

U.S. PATENT DOCUMENTS

| | | | | |
|---|---|---|---|---|
| 2013/0186976 A1* | 7/2013 | Ishihara | ............. | B05B 17/06 239/102.1 |
| 2015/0264791 A1* | 9/2015 | Nikipelov | ............. | H05G 2/005 250/504 R |
| 2016/0320708 A1* | 11/2016 | Lu | ............. | H05G 2/005 |
| 2016/0334711 A1* | 11/2016 | Eurlings | ............. | G02B 27/0905 |

* cited by examiner

*Primary Examiner* — Jason L McCormack
(74) *Attorney, Agent, or Firm* — McClure, Qualey & Rodack, LLP

(57) ABSTRACT

A method for operating a semiconductor apparatus includes generating a plurality of target droplets, deforming the target droplets into a plurality of target plumes respectively, changing an orientation of at least one of the target plumes, and generating a plurality of EUV radiations from the target plumes respectively. At least one of the EUV radiations irradiates an area on the light collector different from other EUV radiations in response to the orientation of the at least one of the target plumes.

20 Claims, 7 Drawing Sheets

SEMICONDUCTOR APPARATUS AND METHOD OF OPERATING THE SAME

PRIORITY CLAIM AND CROSS-REFERENCE

This application claims priority to U.S. provisional application Ser. No. 62/753,059, filed on Oct. 30, 2018, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For example, higher resolution lithography processes have been developed. One lithography technique is extreme ultraviolet lithography (EUVL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
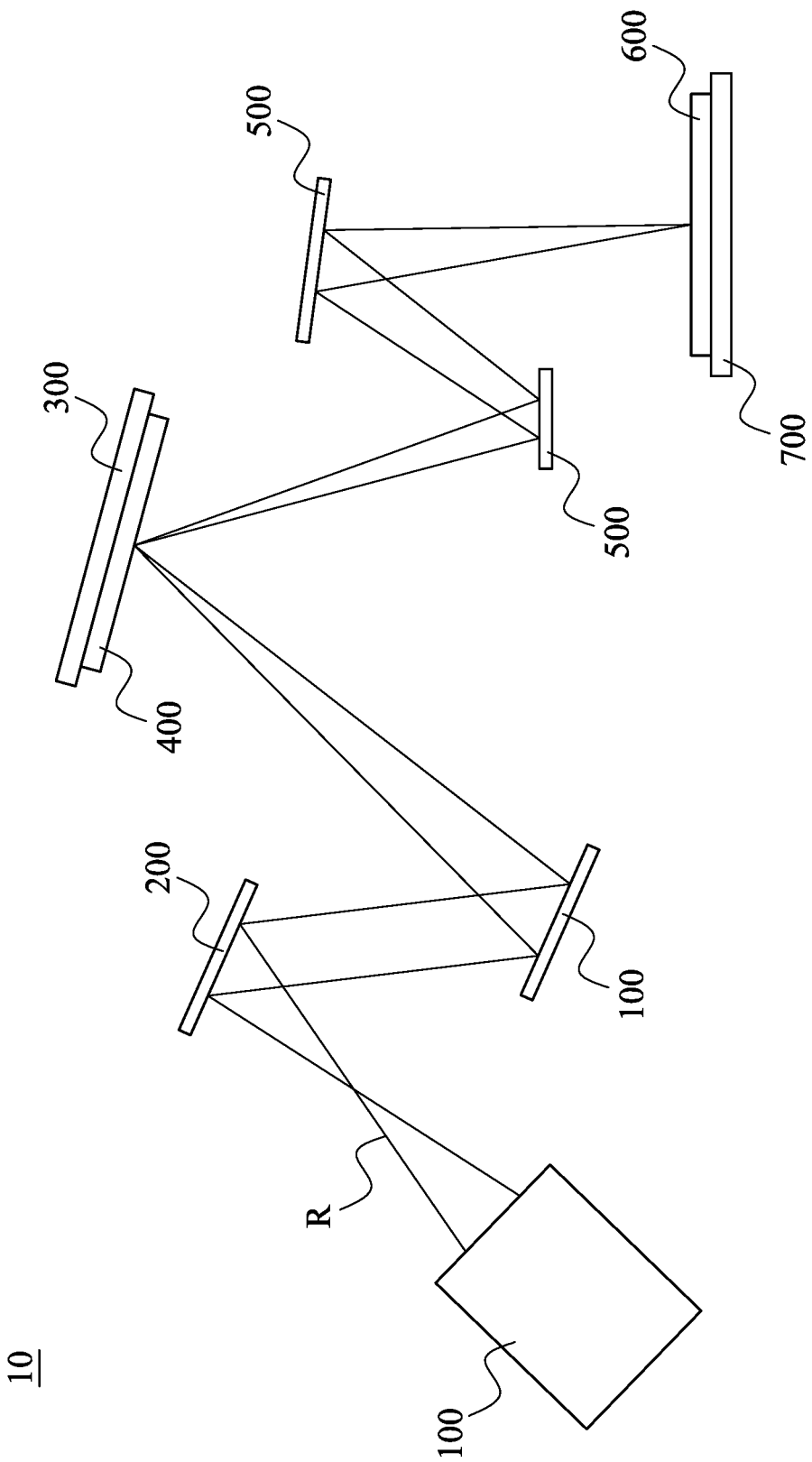
FIG. 1 is a schematic diagram illustrating an EUV lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about", "substantially" or "approximately" shall generally mean within 20 percent, within 10 percent, or within 5 percent of a given value or range. Numerical quantities given herein are approximate, meaning that the term "around", "about", "substantially" or "approximately" can be inferred if not expressly stated.

Regarding an extreme ultraviolet (EUV) lithography process, an EUV light source is generated to expose a target wafer. More specifically, the EUV light source (also known as a laser produced plasma (LPP) EUV radiation source) may be generated by exciting a metal droplet, such as the tin droplet, through a laser source. Subsequently, an EUV radiation from the EUV light source may be collected and reflected by a light collector (also known as a collector, a LPP collector, or an EUV collector) to an exposing system for patterning the target wafer. However, the light collector may be degraded due to contamination including particle accumulation, ion damage, radiation, oxidation, blister, and debris deposition thereon, such that the EUV radiation reflected by the light collector may be subsequently deteriorated. As a result, in an effort to adequately address the aforementioned issues, an EUV light source module, a method for cleaning a light collector, and an EUV lithography process are presented hereinafter in accordance with various embodiments of the present disclosure for reducing the contamination impacting the light collector and increasing the lifetime of the light collector.

Reference is made to FIG. 1, which is a schematic diagram illustrating an EUV lithography system 10 in accordance with some embodiments of the present disclosure. The lithography system 10 may also be referred as a scanner, which is operable to perform lithography processes through the EUV radiation R. More specifically, the EUV lithography system 10 includes an EUV light source module 100, which is configured to generate the EUV radiation R. For example, the EUV radiation R may have a wavelength ranging between about 1 nm and about 100 nm, and particularly, at about 13.5 nm. Subsequently, the EUV lithography system 10 employs an EUV mask 400, on which there is a circuitry pattern, to reflect the EUV radiation R. Hence, the circuitry pattern on the EUV mask 400 may be precisely duplicated onto a target wafer 600 by exposing a photoresist on the target wafer 600 to the EUV radiation R. Since the wavelength of the EUV radiation R is approximately 15 times shorter than that of a radiation used in the current deep ultraviolet lithography process, a feature on a chip (which is cut from the target wafer 600) may possibly continue to scale down for further decreasing the chip size and/or increasing the chip performance.

In some embodiments, the lithography system 10 includes an illuminator 200. More specifically, the illuminator 200 includes a variety of optic components, such as a refractive optics system having multiple lenses and/or a reflective optics system having multiple mirrors, so as to direct the EUV radiation R from the EUV light source module 100 toward a mask stage 300, on which the EUV mask 400 is held.

Additionally, the mask stage 300 is configured to secure the EUV mask 400. In some embodiments, the mask stage 300 is an electrostatic chuck (also known as an S-chuck or an R-chuck), which may hold the EUV mask 400 through attraction force therebetween. Since even a gas molecule may absorb the EUV radiation R and lower its intensity, the lithography system 10 is designed to be positioned in a vacuum environment to avoid intensity loss of the EUV radiation R. The electrostatic chuck merely utilizes attraction force to hold the EUV mask 400, such that the use of the electrostatic chuck does not result in presence of particle and/or gas molecule.

In some embodiments, the lithography system 10 includes a projection optics module 500 (also known as a projection optics box (POB)). The projection optics module 500 is configured to transfer the circuitry pattern of the EUV mask 400 onto the target wafer 600 secured by a wafer stage 700 after the EUV radiation R is reflected by the EUV mask 400. The projection optics module 500 includes a variety of refractive optics and/or reflective optics arranged based on various designs. The EUV radiation R, which is reflected by the EUV mask 400 and carrying the circuitry pattern thereon, is directed toward the target wafer 600 by the projection optics module 500. Hence, due to the configurations of the illuminator 200 and the projection optics module 500, the EUV radiation R may focus on the EUV mask 400 and the target wafer 600 with suitable traits, such as intensity and clearness.

It should be noted that the lithography system 10 may further include other module(s) or be integrated with other modules based on various designs. For example, in some embodiments, the lithography system 10 includes a gas supply module, which is in fluid communication with the EUV light source module 100 and configured to provide reactant gas thereto, such as hydrogen gas, for helping with reduction of contamination in the EUV light source module 100. It should be also noted that the terms of mask, photomask, and reticle may be used interchangeably in the present disclosure.

Figure 2:
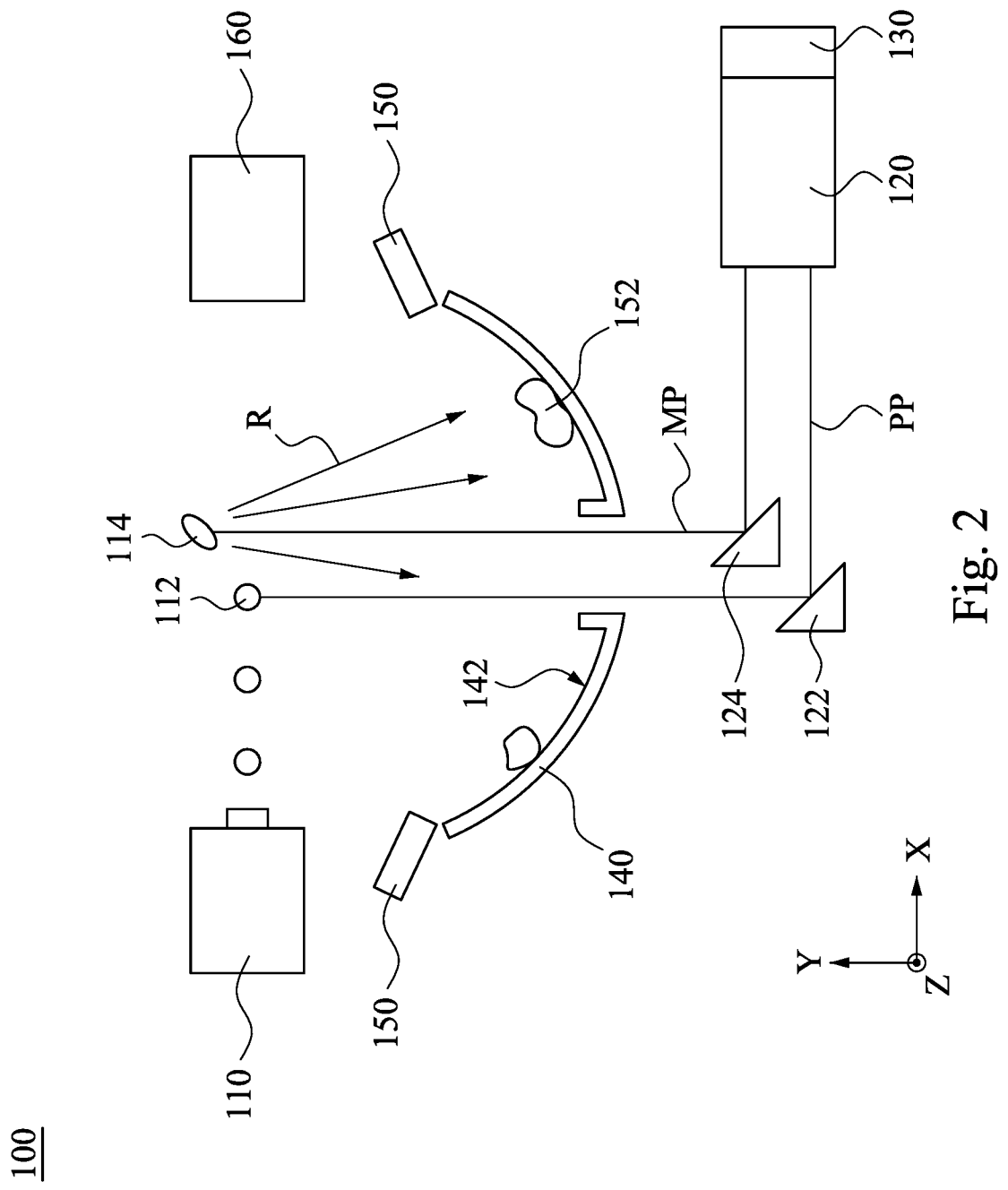
FIG. 2 is a schematic diagram illustrating the EUV light source module in accordance with some embodiments of the present disclosure.

Reference is made to FIG. 2, which is a schematic diagram illustrating the EUV light source module 100 in accordance with some embodiments of the present disclosure. The EUV light source module 100 includes a droplet generator 110, a laser source 120, a moving unit 130, a light collector 140, a gas supply 150, and a droplet catcher 160. It should be noted that components of the EUV light source module 100 may be further added or omitted based on various designs.

The droplet generator 110 generates a plurality of target droplets 112. The target droplets 112 may have at least one material among a group including tin (Sn), tin containing liquid material such as eutectic tin alloy, lithium (Li), xenon (Xe), combinations thereof, or the like. In some embodiments, the target droplet 112 may have a diameter about 30 microns (μm). In some embodiments, the target droplets 112 are generated one at a time with substantially the same period between two contiguous target droplets 112.

The laser source 120 produces a variety of lasers for exciting the target droplets 112 to further generate a plurality of EUV radiations R used in EUV lithography process. In some embodiments, the laser source 120 may employ a dual pulse laser-produced plasma (LPP) mechanism. More specifically, the laser source 120 may utilize two types of lasers, such as the pre-pulse laser PP and the main-pulse laser MP, for generating the EUV radiations R from the target droplets 112 step by step.

In some embodiments, both the pre-pulse laser PP and the main-pulse laser MP are produced by the same laser source 120. More specifically, the pre-pulse laser PP may have less intensity and smaller spot size than those of the main-pulse laser MP. The pre-pulse laser PP is used to heat (or pre-heat) the target droplets 112 one at a time to deform the target droplets 112 into a plurality of target plumes 114 respectively. The target plumes 114 substantially have a pancake shape with a lower density and a higher reaction area than the target droplets 112. Subsequently, the main-pulse laser MP is used to further heat (or reheat) the corresponding target plumes 114 one at a time to generate a plurality of EUV radiations R. In some embodiments, the pre-pulse laser PP may have a spot size about 100 μm or less, and the main-pulse laser MP may have a spot size in a range from about 200 μm to about 300 μm, such as about 225 μm, such that the target droplets 112 and the target plumes 114 may be fully heated by the pre-pulse laser PP and the main-pulse laser MP respectively. In some embodiments, the pre-pulse laser PP and the main-pulse laser MP may be generated to have certain driving powers to fulfill desired wafer volume production, e.g., a throughput of about 150 wafers per hour. In some embodiments, at least one of the pre-pulse laser PP and the main-pulse laser MP is a carbon dioxide ($CO_2$) laser source. In some embodiments, at least one of the pre-pulse laser PP and the main-pulse laser MP is a neodymium-doped yttrium aluminum garnet (Nd-YAG) laser source.

On the other hand, the pre-pulse laser PP and the main-pulse laser MP may be respectively directed by a variety of optic components, such as the first optics 122 and the second optics 124, into the excitation zone for interacting with the target droplets 112 and the target plumes 114 correspondingly. In some embodiments, generation of the pre-pulse laser PP is synchronized with that of the target droplets 112. Further, generation of the main-pulse lasers MP is coordinated with that of the pre-pulse lasers PP, such that each of the main-pulse lasers MP may come after a corresponding one of the pre-pulse lasers PP by substantially the same time delay. Hence, as the target droplets 112 move straightly through the excitation zone, the pre-pulse lasers PP may precisely collide with corresponding target droplets 112 respectively and transform them into low-density target plumes 114. Additionally, the time delay between the pre-pulse laser PP and the main-pulse laser MP may be controlled to allow the target plume 114 to have optimal size and geometry. When the main-pulse laser MP heats the target plume 114, a high-temperature plasma is accordingly generated to further emit an EUV radiation R. Due to the optimization of size and geometry of the target plume 114, the intensity of the EUV radiation R may be maximized while an amount of debris from the target plume 114 may be minimized.

The light collector 140 collects the EUV radiation R emitted by the plasma. More specifically, the light collector 140 may sequentially collect, reflect, and direct the EUV radiation R for the EUV lithography process. The light collector 140 is configured with appropriate coating material and shape so as to function as a mirror for collection, reflection, and focus of the EUV radiation R. In some embodiments, the light collector 140 has an ellipsoidal geometry, e.g., a bowl shape. Further, the light collector 140 has a through hole at a center thereof for allowing laser beams from the laser source 120 to pass through. In some embodiments, the coating material of the light collector 140 includes a plurality of reflective layers, such as molybdenum-silicon (Mo/Si) film pairs, in which a layer of molybdenum is above or below a layer of silicon in each film pair. Alternatively, the reflective layers may include molybdenum-beryllium (Mo/Be) film pairs, other suitable arranged materials with high reflective indexes toward the EUV radiation R, combinations thereof, or the like. Additionally, the light collector 140 may further include a capping layer coated on the reflective layers for protection against the abovementioned contamination. In some embodiments, the capping layer includes ruthenium (Ru) based material.

When it comes to the lifetime of the light collector 140, contamination including particle accumulation, ion damage, radiation, oxidation, blister, and debris deposition thereon may be mentioned. Further, among these causes, the debris deposition may be considered as a critical one. Hence, one means to mitigate the contamination described above refers to introducing hydrogen gas 152 into a space proximate the reflective surface 142 of the light collector 140.

The gas supply 150 is in fluid communication with the chamber, in which the EUV light source module 100 is positioned, and configured to provide hydrogen gas 152 to the light collector 140. More specifically, hydrogen gas 152 has bad absorption ability toward the EUV radiation R, so that the intensity of the EUV radiation R may not be influenced significantly. In some embodiments, as the reflective surface 142 is shrouded by hydrogen gas 152, hydrogen ion ($H^+$) may be generated from hydrogen gas 152 through the EUV radiation R and then react with debris (e.g., tin residual) on and/or around the reflective surface 142 to form stannane ($SnH_4$). Stannane is a gaseous compound that may be easily thrown out from the chamber, such that debris deposition may be decreased accordingly.

The droplet catcher 160 is opposite and aligned with the droplet generator 110. More specifically, the droplet catcher 160 is configured to receive excessive target droplets 112 and some debris from target plumes 114. In some embodiments, in order to adjust the EUV radiation R for exposing the target wafer 600, some target droplets 112 are intentionally missed by both the pre-pulse laser PP and the main-pulse laser MP, so that the droplet catcher 160 may retrieve the missed target droplets 112 and avoid wasting the target droplets 112.

However, since cooperation of the pre-pulse laser PP and the main-pulse laser MP (e.g., respective emitting timing, respective light intensity, and time delay therebetween) is fixed, the EUV radiations R may be distributed over a specific area on the reflective surface 142 of the light collector 140 while debris may be sputtered over an area opposite to the specific area. Consequently, a rate of debris deposition may be greater than a rate of debris removal at the area opposite to the specific area, such that debris deposition would jeopardize EUV lithography process soon since the EUV radiation R reflected by the light collector 140 may gradually weaken. In order to further mitigate the problem of debris deposition, a method and a device for cleaning the light collector 140 together with more detailed descriptions thereof are presented below.

Figure 3B:
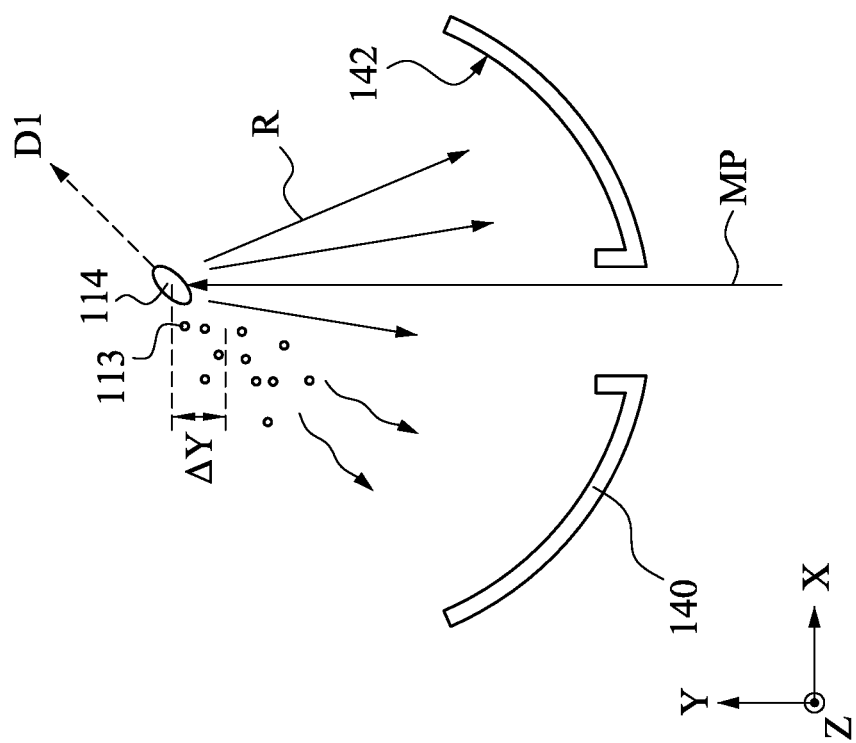
FIGS. 3A and 3B are schematic diagrams illustrating a relationship between collision position of target droplet and orientation of target plume in accordance with some embodiments of the present disclosure.
Figure 3A:
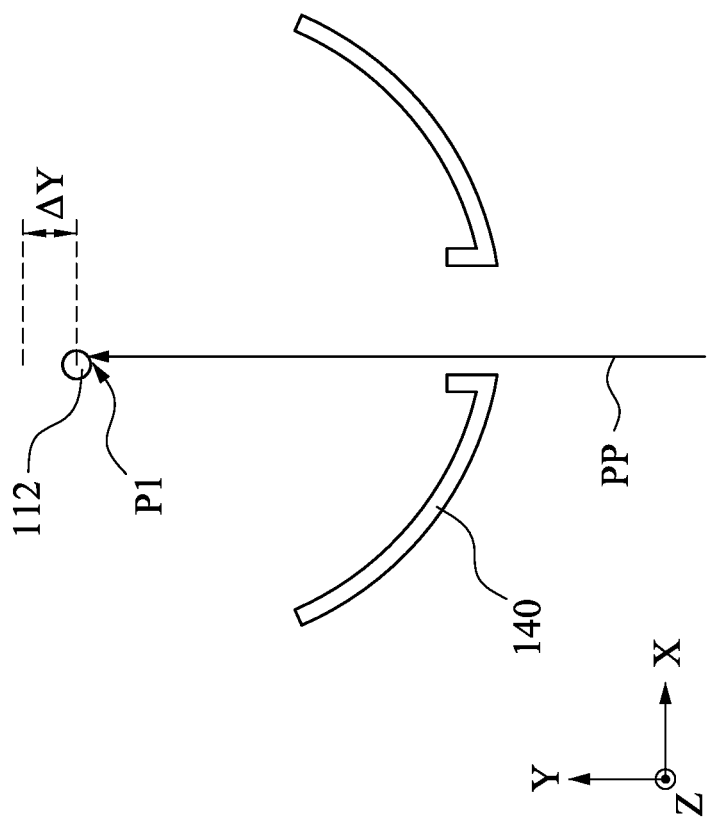

Reference is made to FIGS. 3A and 3B, which are schematic diagrams illustrating a relationship between collision position P1 of target droplet 112 and orientation D1 of target plume 114 in accordance with some embodiments of the present disclosure. As shown in FIG. 3A, when the target droplet 112 arrives at the excitation zone above the through hole of the light collector 140, the emitted pre-pulse laser PP may pass through the through hole and collide with the target droplet 112. The collision position P1 of the target droplet 112 may be located at the right side of the target droplet 112. As shown in FIG. 3B, after the collision of the pre-pulse laser PP, the target droplet 112 may move along a direction between the X and Y directions due to the inertia of the target droplet 112 and the impact of the pre-pulse laser PP. Further, the target droplet 112 may be transformed into the target plume 114. Due to the impact of the pre-pulse laser PP at the right side of the target droplet 112, the right side of the target plume 114 may be higher than the left side thereof, such that the orientation D1 (or the lengthwise direction) of the target plume 114 may be oriented upper right.

Subsequently, the target plume 114 may be fully heated by the main-pulse laser MP, such that the EUV radiation R may be generated and mostly irradiate the right side of the reflective surface 142 since the heated surface of the target plume 114 faces toward the right side of the reflective surface 142. In the meantime, some debris 113 from the target plume 114 may also be produced and mostly sputter along a direction opposite to the orientation D1. As described above, the EUV radiation R may facilitate the cleaning of debris deposition. Hence, more cleaning may be conducted toward the right side of the reflective surface 142 while less debris 113 may be deposited thereon.

On the other hand, due to the impact of the pre-pulse laser PP, the position of the target plume 114 may be higher than the position of the target droplet 112. Accordingly, a distance $\Delta y$ with respect to the Y direction may occur between the target droplet 112 and the target plume 114 as indicated in FIGS. 3A and 3B. When the position of the target plume 114 is higher, an irradiated area on the reflective surface 142 may be larger. Additionally, the debris 113 may be distributed over a larger area on the reflective surface 142 as well, such that rate of debris deposition at each spot on the reflective surface 142 may be more limited and equalized. The distance $\Delta y$ is positively proportional to the intensity of the pre-pulse laser PP. Hence, the irradiated area on the reflective surface 142 may be adjusted through manipulating the intensity of the pre-pulse laser PP.

Figure 4B:
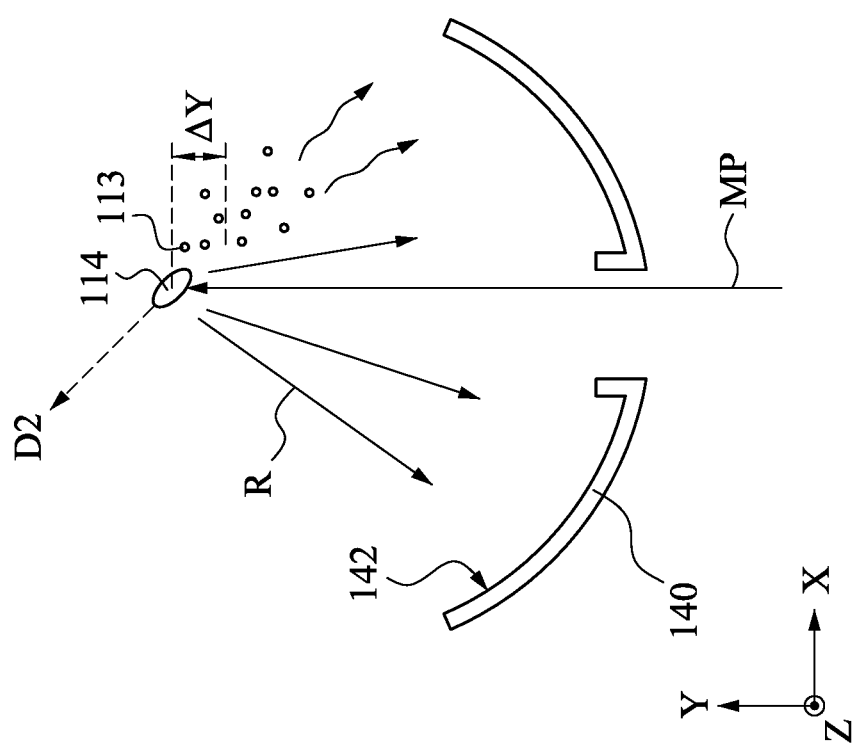
FIGS. 4A and 4B are schematic diagrams illustrating other relationship between collision position of target droplet and orientation of target plume in accordance with some embodiments of the present disclosure.
Figure 4A:
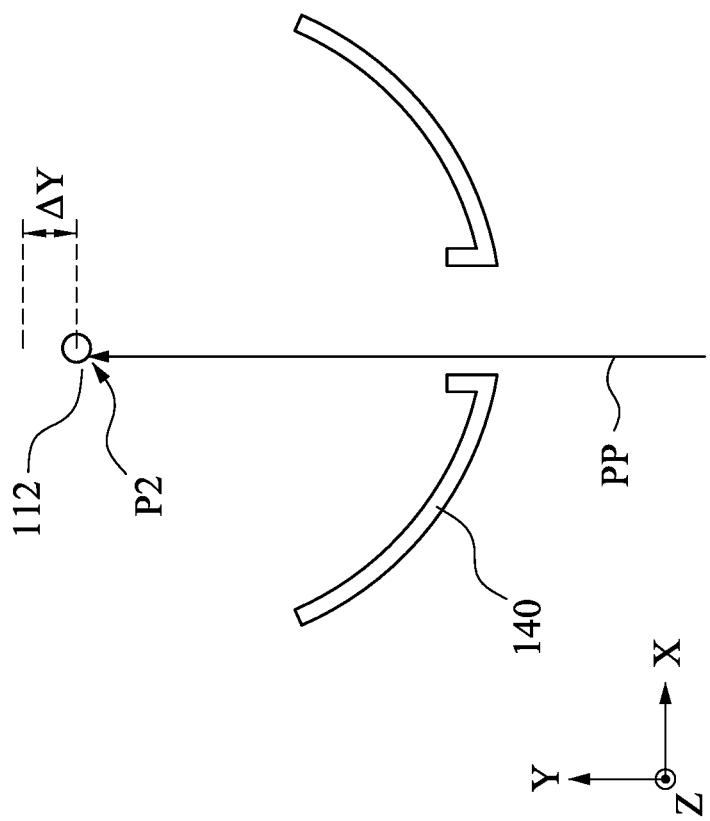

Reference is made to FIGS. 4A and 4B, which are schematic diagrams illustrating other relationship between collision position P2 of target droplet 112 and orientation D2 of target plume 114 in accordance with some embodiments of the present disclosure. Since some descriptions of FIGS. 4A and 4B are similar to those corresponding descriptions of FIGS. 3A and 3B, those descriptions will not be repeated hereinafter. As shown in FIG. 4A, the collision position P2 of the target droplet 112 may be located at the left side of the target droplet 112. Due to the impact of the pre-pulse laser PP at the left side of the target droplet 112, the left side of the target plume 114 may be higher than the right side thereof, such that the orientation D2 (or the lengthwise direction) of the target plume 114 may be oriented upper left.

Similarly, after the target plume 114 is fully heated by the main-pulse laser MP, the generated EUV radiation R may mostly irradiate the left side of the reflective surface 142 since the heated surface of the target plume 114 faces toward the left side of the reflective surface 142. In the meantime, the produced debris 113 from the target plume 114 may mostly sputter along a direction opposite to the orientation D2. Hence, more cleaning may be conducted toward the left side of the reflective surface 142 while less debris 113 may be deposited thereon.

Figure 5B:
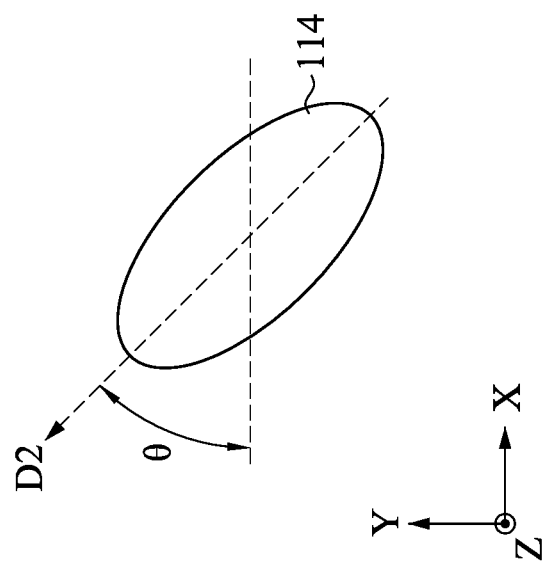
FIGS. 5A and 5B are schematic diagrams illustrating a relationship between collision position of target droplet and rotation angle of target plume in accordance with some embodiments of the present disclosure.
Figure 5A:
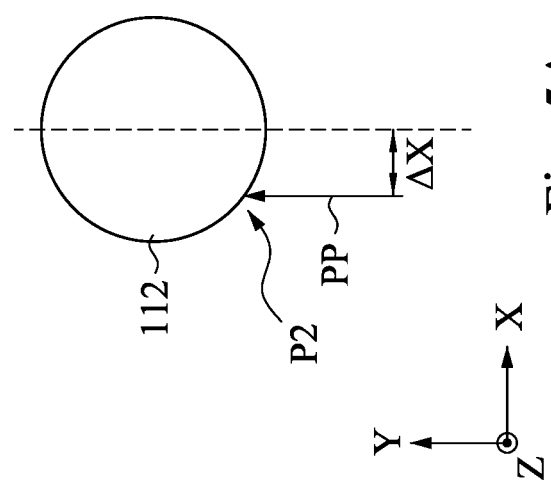

Reference is made to FIGS. 5A and 5B, which is a schematic diagram illustrating a relationship between collision position P2 of target droplet 112 and rotation angle θ of target plume 114 in accordance with some embodiments of the present disclosure. As described above, when the pre-pulse laser PP collide with the target droplet 112 at a collision position thereon, the target plume 114 with a corresponding orientation may be generated. Further, the orientation of the target plume 114 and the X direction may define a rotation angle θ therebetween. The rotation angle θ represents the slope of the target plume 114. Additionally, the rotation angle θ has relations with the intensity of the pre-pulse laser PP and the collision position of the target droplet 112. In some embodiments, as shown in FIG. 5A, the pre-pulse laser PP collides with the target droplet 112 at the left side thereof. When the distance Δx is fixed, the rotation angle θ as shown in FIG. 5B is positively proportional to the intensity of the pre-pulse laser PP. When the intensity of the pre-pulse laser PP is fixed, the rotation angle θ is positively proportional to the distance Δx between the pre-pulse laser PP and the centerline of the target droplet 112. Hence, the rotation angle θ (or the slope) of the target plume 114 may be adjusted through manipulation of the intensity of the pre-pulse laser PP and/or the distance Δx.

On the other hand, since a direction of the EUV radiation R corresponds to a facing direction of a surface of the target plume 114 toward the reflective surface 142, the irradiated area on the reflective surface 142 may be adjusted through changing the facing direction of the surface of the target plume 114. For example, when the rotation angle θ is increased, the slope of the target plume 114 may be larger as well, such that the EUV radiation R from the target plume 114 may irradiate a peripheral region of the reflective surface 142. Conversely, when the rotation angle θ is decreased, the slope of the target plume 114 may be smaller as well, such that the EUV radiation R from the target plume 114 may irradiate a central region of the reflective surface 142.

It should be noted that the collision position of the target droplet 112 is not limited by the aforementioned aspects of the present disclosure. In some embodiments, the collision position of the target droplet 112 may be distributed along the Z direction. In some embodiments, the collision position of the target droplet 112 may be distributed between the X and Z directions. Hence, multiply oriented target plumes 114 may be generated through changing the collision position of the target droplet 112 and the intensity of the pre-pulse laser PP, such that the reflective surface 142 may be fully irradiated by the EUV radiations R from the multiply oriented target plumes. Additionally, in coordination with the reactant gas cleaning method described above, the problem of debris deposition on the reflective surface 142 may be further mitigated.

Figure 6:
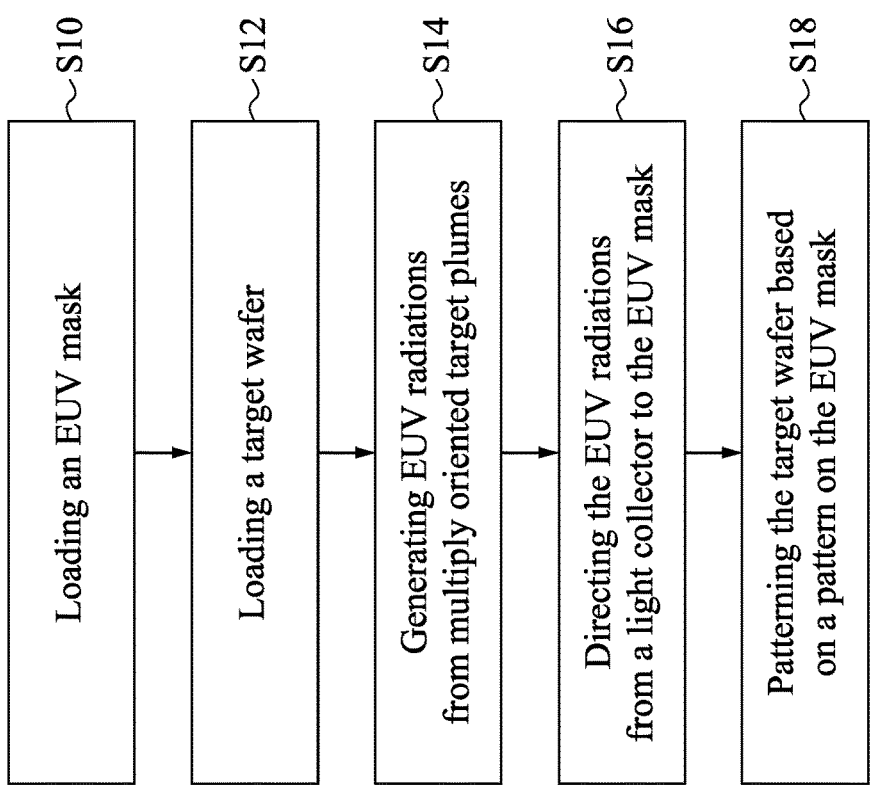
FIG. 6 is a flowchart illustrating a method for an EUV lithography process through the EUV lithography system in accordance with some embodiments of the present disclosure.

Reference is made to FIG. 6, which is a flowchart illustrating a method for an EUV lithography process through the EUV lithography system 10 in accordance with some embodiments of the present disclosure. More specifically, the method includes a plurality of operations, e.g., operations S10 to S18. More explicit descriptions about the operations will be presented below. For illustration purposes, the EUV lithography system 10 shown in FIG. 1 is referenced to collectively describe the details of the method. It should be noted that additional operation(s) may be provided before, during, and/or after the method, and operation(s) described may be replaced, eliminated, or moved around for some embodiments of the method.

The operation S10 is performed for loading the EUV mask 400. More specifically, the EUV mask 400 has IC pattern thereon that may be transferred onto the target wafer 600. Additionally, the operation S10 may further include various steps, such as securing the EUV mask 400 on the mask stage 300 and performing an alignment therebetween.

The operation S12 is performed for loading the target wafer 600. More specifically, the target wafer 600 is secured on the wafer stage 700. On the other hand, the target wafer 600 may be coated with photoresist that is sensitive to the EUV radiation R for facilitating the EUV lithography process.

The operation S14 is performed for generating EUV radiations from multiply oriented target plumes 114. More specifically, the EUV light source module 100 of the EUV lithography system 10 is utilized to generate the EUV radiation R for exposing the target wafer 600. In some embodiments, the operation S14 may include a plurality of sub-operations that will further described below.

Figure 7:
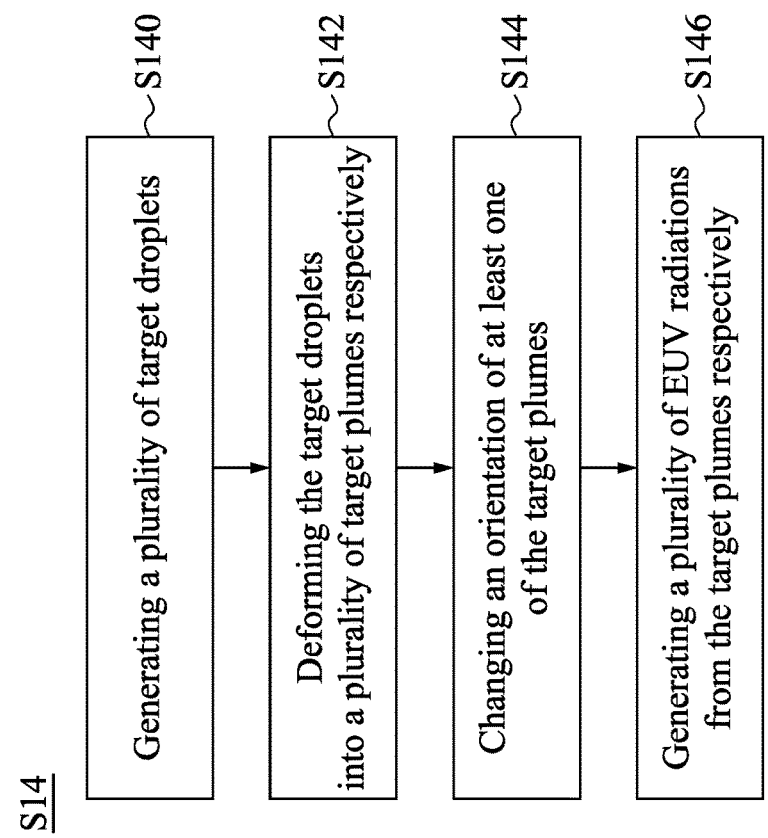
FIG. 7 is a flowchart illustrating sub-operations of the operation S14 of FIG. 6 in accordance with some embodiments of the present disclosure.

Reference is made to FIG. 7, which is a flowchart illustrating sub-operations of the operation S14 of FIG. 6 in accordance with some embodiments of the present disclosure. More specifically, the operation S14 may include the sub-operations S140 to S146 as presented below.

The sub-operation S140 is performed for generating a plurality of target droplets 112 by the droplet generator 110. In some embodiments, the target droplets 112 are generated one at a time with substantially the same period between two contiguous target droplets 112. In some embodiments, the generating frequency of the target droplets 112 is variable to work in coordination with the exposure of the target wafer 600. After generated, the target droplets 112 are continuously introduced into an excitation zone above the light collector 140 for the following operations.

The sub-operation S142 is performed for deforming the target droplets 112 into a plurality of target plumes 114 respectively. More specifically, the laser source 120 may emit a plurality of pre-pulse lasers PP to respectively collide with the target droplets 112, such that the target droplets 112 with ball shape may be transformed into the target plumes 114 with plate shape. In some embodiments, the generation of the pre-pulse lasers PP may be synchronized with the generation of the target droplets 112, such that each of the target droplets 112 may be precisely collided. In some embodiments, at least one of the target droplets 112 may be deliberately missed by the corresponding pre-pulse laser PP and the following main-pulse laser MP for adjusting the generation of the EUV light.

The sub-operation S144 is performed for changing an orientation of at least one of the target plumes 114. As described above, the orientation of the target plume 114 may determine the irradiating direction of the corresponding EUV radiation R. Hence, the irradiated area on the reflective surface 142 may be variable rather than fixed by changing the orientation of the target plume 114, so as to mitigate the problem of debris deposition. Further, the orientation of the target plume 114 may be adjusted through manipulating the collision position of the target droplet 112 and the intensity of the pre-pulse laser PP. Consequently, a variety of means to change collision position of target droplet is further described below.

Figure 8:
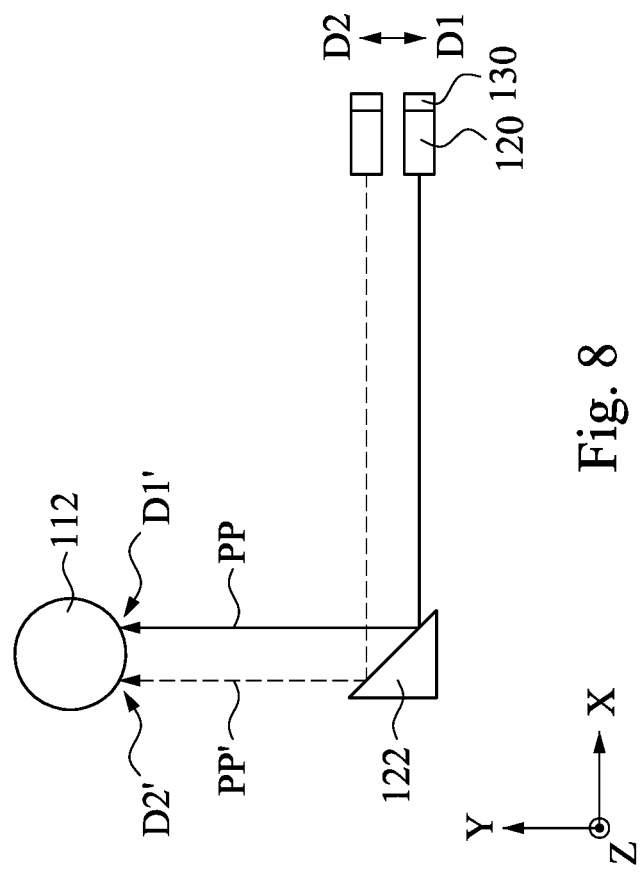
FIG. 8 is a schematic diagram illustrating how to change collision position of target droplet in accordance with some embodiments of the present disclosure.

Reference is made to FIG. 8, which is a schematic diagram illustrating how to change collision position of target droplet 112 in accordance with some embodiments of the present disclosure. As described above, the pre-pulse laser PP may be directed by a variety of optic components, such as the first optics 122, into the excitation zone for colliding with the target droplet 112. In some embodiments, the moving unit 130 is connected to the laser source 120 for vertically and/or horizontally shifting the laser source 120. For example, when the laser source 120 emits the pre-pulse laser PP at the emitting position D1, the pre-pulse laser PP (as shown by the solid line) may collide with the target droplet 112 at the collision position D1'. As another example, when the laser source 120 emits the pre-pulse laser PP' at the emitting position D2, the pre-pulse laser PP' (as shown by the dotted line) may collide with the target droplet 112 at the collision position D2'. Hence, the moving unit 130 may control the collision position of the target droplet 112 through the movement of the laser source 120. In some embodiments, an absolute value of a distance between the collision positions D1' and D2' may range between about 0 μm and about 10 μm. If the absolute value of the distance is greater than about 10 μm, the pre-pulse laser may miss the corresponding target droplet 112.

In some embodiments, as shown in FIG. 8, the moving unit 130 may shift the laser source 120 along the Y direction and/or the Z direction. Hence, the pre-pulse laser may be controlled to collide with the target droplet 112 at any specific collision position of the lower half portion thereof. In some embodiments, a plurality of the collision positions of the target droplets may be arranged in a circular distribution to generate the target plumes with different orientations, such that the reflective surface 142 of the light collector 140 may be fully irradiated by the EUV radiations R from the corresponding target plumes 114.

On the other hand, in some embodiments, the first optics 122 may be movable for adjusting the collision position of the target droplet 112. In some embodiments, the movement of the moving unit 130 may be coordinated with the movement of the first optics 122.

Figure 9:
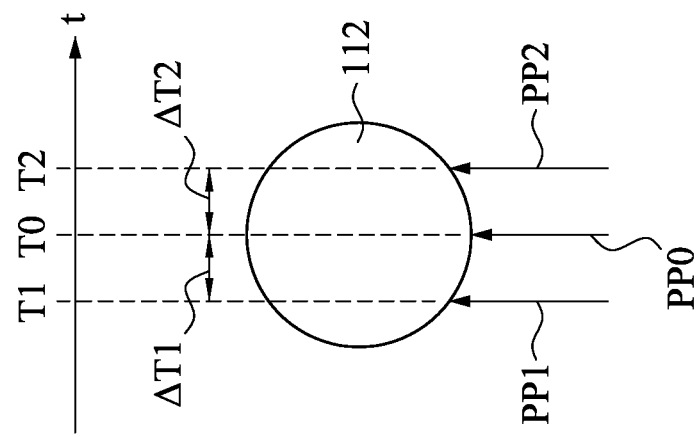
FIG. 9 is a schematic diagram illustrating how to change collision position of target droplet in accordance with some other embodiments of the present disclosure.

Reference is made to FIG. 9, which is a schematic diagram illustrating how to change collision position of target droplet 112 in accordance with some other embodiments of the present disclosure. More specifically, the emitting time of the pre-pulse laser may influence the collision position of the target droplet 112. As shown in FIG. 9, when the emitting of the pre-pulse lasers are full coordination with the generation of the target droplets, the collision positions of the target droplets 112 may be substantially the same. For example, under the aforementioned condition, each of the pre-pulse lasers PP0 may be emitted at the timing T0 and collide with the corresponding target droplet 112 at the central portion thereof.

In some embodiments, a pre-pulse laser PP1 may be emitted at the timing T1 earlier than the pre-pulse laser PP0 by a time period ΔT1, such that the collision position of the target droplet 112 may transfer from the central portion thereof to the left portion thereof. In some embodiments, a pre-pulse laser PP2 may be emitted at the timing T2 later than the pre-pulse laser PP0 by a time period ΔT2, such that the collision position of the target droplet 112 may transfer from the central portion thereof to the right portion thereof. Hence, the changing of collision position of the target droplet 112 may lead to the changing of orientation of the target plume 114. In some embodiments, an absolute value of the time period ΔT1 and ΔT2 may range between about 0 μs and about 1 μs. If the absolute value of the time period is greater than about 1 μs, the pre-pulse laser may miss the corresponding target droplet 112.

In some embodiments, the emitting time of the pre-pulse laser, the movement of the laser source 120, and the intensity of the pre-pulse laser may be coordinated for collectively controlling the orientation of the target plume 114. In some embodiments, the collision positions of the target droplets 112 may be alternately changed, such that the reflective surface 142 of the light collector 140 may be evenly irradiated by the EUV radiations R generated from the target plumes 114.

In some embodiments, the collision positions of the target droplets 112 may be continuously changed, such that the orientations of corresponding target plumes 114 may vary accordingly. For example, the target plumes 114 may have at least two different orientations, such as two different orientations, three different orientations, or more, so as to make corresponding EUV radiations R irradiate different areas of the light collector 140. In some embodiments, after an orientation of a target plume 114 is changed, another orientation of another one of the target plumes 114 may return to be an original orientation. For example, three target plumes 114 respectively have a first, a second, and a third orientations. After the first orientation is changed to the second orientation, the following third orientation may become different from the first or second orientation, or may return to be the first or second orientation.

Reference is made back to FIG. 7. The sub-operation S146 is performed for generating a plurality of EUV radiations R from the target plumes 114 respectively. More specifically, the laser source 120 may emit a plurality of main-pulse lasers MP to respectively collide with the target plumes 114, such that the target plumes 114 may be excited to generate a plurality of the EUV radiations R. As described above, the orientation of the target plume 114 may be changed by manipulating the emitting time of the pre-pulse laser PP, the movement of the laser source 120, and/or the intensity of the pre-pulse laser PP. Hence, the direction of the EUV radiation R may vary accordingly. In some embodiments, the generation of the pre-pulse lasers PP may be synchronized with the generation of the main-pulse lasers MP, such that each of the target plumes 114 may be properly excited.

Reference is made back to FIG. 6. The operation S16 is performed for directing the EUV radiation R from the light collector 140 to the EUV mask 400. More specifically, after the EUV radiation R is generated, the EUV radiation R may head for the reflective surface 142 of the light collector 140 and then be reflected by the light collector 140. The reflected EUV radiation R may be directed by the illuminator 200 and then reach the EUV mask 400.

The operation S18 is performed for patterning the target wafer 600 based on the pattern on the EUV mask 400. More specifically, after the EUV radiation R struck on the EUV mask 400, the EUV mask 400 with the circuitry pattern thereon may reflect the incident EUV radiation R to the projection optics module 500. Subsequently, the reflected EUV radiation R may be directed by the projection optics module 500 to pattern the target wafer 600. Due to the configuration of the projection optics module 500, the circuitry pattern on the EUV mask 400 may be precisely transferred onto the target wafer 600.

Based on the above-mentioned descriptions, various advantages may be provided by the present disclosure. In detail, a direction of an EUV radiation may vary in response to an orientation of a target plume. The target plume is transformed from a target droplet through collision of a pre-pulse laser from a laser source. Hence, the orientation of the target plume may be controlled by manipulating at least one of an emitting time of the pre-pulse laser, a movement of the laser source, and an intensity of the pre-pulse laser, such that an irradiated area on a light collector by the EUV radiation may be deliberately arranged. Further, the EUV radiations with different directions may facilitate the cleaning of each spot on the light collector and also mitigate the problem of debris deposition.

In some embodiments, a method includes generating a plurality of target droplets, deforming the target droplets into a plurality of target plumes respectively, changing an orientation of at least one of the target plumes, and generating a plurality of EUV radiations from the target plumes respectively. At least one of the EUV radiations irradiates an area on the light collector different from other EUV radiations in response to the orientation of the at least one of the target plumes.

In some embodiments, a method includes generating a plurality of target droplets, deforming the target droplets into a plurality of target plumes by a plurality of pre-pulse lasers respectively, exciting the target plumes to generate a plurality of EUV radiations by a plurality of main-pulse lasers respectively, and irradiating a light collector by the EUV radiations, directing the EUV radiations from the light collector to an EUV mask, and patterning a target wafer based on a pattern on the EUV mask. An intensity of at least one of the pre-pulse lasers and/or a collision position of at least one of the target droplets are changed, such that an irradiated area on the light collector varies in response to a changing of the light intensity and the collision position.

In some embodiments, an apparatus includes a droplet generator, a laser source, and a moving unit. The droplet generator is configured to generate a plurality of target droplets. The laser source is configured to emit a plurality of pre-pulse lasers that deforms the target droplets into a plurality of target plumes respectively and configured to emit a plurality of main-pulse lasers that excites the target plumes to generate a plurality of EUV radiations respectively. The moving unit is connected to the laser source and configured to change a location where at least one of the pre-pulse lasers is generated, such that a collision position of a corresponding one of the target droplets varies accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
generating a plurality of target droplets;
deforming the target droplets into a plurality of target plumes respectively, wherein the target plumes are farther from a light collector than the corresponding target droplets;
changing an orientation of at least one of the target plumes; and
generating a plurality of EUV radiations from the target plumes respectively, wherein at least one of the EUV radiations irradiates an area on the light collector different from other EUV radiations in response to the orientation of the at least one of the target plumes.

2. The method of claim 1, further comprising:
introducing a reactant gas to a reflective surface of the light collector, wherein the reactant gas interacts with the EUV radiations to clean the reflective surface.

3. The method of claim 1, further comprising:
changing another orientation of another one of the target plumes, wherein the orientation of the at least one of the target plumes is different from the another orientation of the another one of the target plumes.

4. The method of claim 1, wherein deforming the target droplets comprises:
emitting a plurality of pre-pulse lasers; and
colliding with the target droplets by the pre-pulse lasers respectively, wherein the pre-pulse lasers are emitted one at a time with substantially the same period between two contiguous pre-pulse lasers and collide with the target droplets at substantially the same position thereon.

5. The method of claim 4, wherein changing the orientation comprises:
emitting at least one of the pre-pulse lasers earlier than other pre-pulse lasers by a first time period.

6. The method of claim 5, wherein changing the orientation comprises:
emitting another one of the pre-pulse lasers later than other pre-pulse lasers by a second time period.

7. The method of claim 6, wherein an absolute value of one of the first and second time periods ranges between about 0 μs and about 1 μs.

8. The method of claim 4, wherein changing the orientation comprises:
changing a collision position of at least one of the target droplet, wherein the collision position of the at least one of the target droplet is different from another collision position of another target droplet by a distance.

9. The method of claim 8, wherein an absolute value of the distance ranges between about 0 μm and about 10 μm.

10. The method of claim 8, wherein changing the orientation comprises:
alternately changing collision positions of the target droplets.

11. The method of claim 4, wherein changing the orientation comprises:

changing an intensity of at least one of the pre-pulse lasers.

12. The method of claim 4, wherein generating the EUV radiations comprises:
emitting a plurality of main-pulse lasers; and
exciting the target plumes by the main-pulse lasers respectively, wherein the pre-pulse lasers are coordinated with the main-pulse lasers, such that each of the main-pulse lasers comes after a corresponding one of the pre-pulse lasers by substantially the same time delay.

13. The method of claim 1, further comprising:
resuming another orientation of another one of the target plumes after the changing the orientation of the at least one of the target plumes.

14. A method, comprising:
generating a first target droplet and a second target droplet;
deforming, by a first pre-pulse laser, the first target droplet into a first target plume, wherein the first target droplet has a first orientation;
generating, by a first main-pulse laser, a first EUV radiation from the first target plume, wherein the first pre-pulse laser and the first main-pulse laser are emitted by a same laser source;
deforming the second target droplet into a second target plume such that the second target plume has a second orientation different from the first orientation of the first target droplet; and
generating a second EUV radiation from the second target plumes.

15. The method of claim 14, wherein deforming the first target droplet comprises:
emitting the first pre-pulse laser to collide with the first target droplet.

16. The method of claim 15, wherein deforming the second target droplet comprises:
emitting a second pre-pulse laser to collide with the second target droplet such that a collision position of the second target droplet is different from a collision position of the first target droplet.

17. The method of claim 15, wherein generating the first EUV radiation comprises:
emitting the first main-pulse laser to excite the first target plume such that the first EUV radiation is formed to irradiate a first area of a light collector.

18. The method of claim 17, wherein generating the second EUV radiation comprises:
emitting a second main-pulse laser to excite the second target plume such that the second EUV radiation is formed to irradiate a second area of the light collector different from the first area of the light collector.

19. A method, comprising:
generating a first target droplet;
emitting a first pre-pulse laser to collide with the first target droplet such that debris from the first target droplet is deposited on a light collector;
emitting a first main-pulse laser to excite the collided first target droplet, wherein the first pre-pulse laser and the first main-pulse laser are emitted by a same laser source;
generating a second target droplet;
emitting a second pre-pulse laser to collide with a side portion of the second target droplet; and
emitting a second main-pulse laser to excite the collided second target droplet such that an EUV radiation is generated from the excited second target droplet, wherein a time when the second pre-pulse laser is emitted is chosen such that at least a portion of the EUV radiation generated from the excited second target droplet propagates substantially towards the debris deposited on the light collector.

20. The method of claim 19, wherein a first time interval between generating the first target droplet and emitting the first pre-pulse laser is different from a second time interval between generating the second target droplet and emitting the second pre-pulse laser.

* * * * *